United States Patent
Colombo et al.

(10) Patent No.: US 6,266,222 B1
(45) Date of Patent: Jul. 24, 2001

(54) ESD PROTECTION NETWORK FOR CIRCUIT STRUCTURES FORMED IN A SEMICONDUCTOR

(75) Inventors: Paolo Colombo, Tradate; Jacopo Mulatti, Latisana; Roberto Annunziata, Monza; Giovanni Campardo, Bergamo; Marco Maccarrone, Palestro, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/223,621

(22) Filed: Dec. 30, 1998

(30) Foreign Application Priority Data

Dec. 31, 1997 (EP) ................................................ 97830741

(51) Int. Cl.[7] ...................................................... H02H 9/04
(52) U.S. Cl. ............................... 361/111; 361/56; 257/362
(58) Field of Search ................................ 361/56, 111, 54, 361/58; 257/361–362, 355, 356

(56) References Cited

U.S. PATENT DOCUMENTS

| | | | |
|---|---|---|---|
| 5,034,845 | * 7/1991 | Murakami | 361/56 |
| 5,159,426 | * 10/1992 | Harrington, III | 257/369 |
| 5,416,351 | * 5/1995 | Ito et al. | 257/357 |
| 5,506,742 | * 4/1996 | Marum | 361/56 |
| 5,521,789 | * 5/1996 | Ohannes et al. | 361/111 |
| 5,530,612 | * 6/1996 | Maloney | 361/56 |
| 5,623,156 | 4/1997 | Watt | 257/355 |
| 5,629,545 | 5/1997 | Leach | 257/362 |
| 5,905,288 | * 5/1999 | Ker | 257/355 |
| 5,991,135 | * 11/1999 | Saleh | 361/56 |

FOREIGN PATENT DOCUMENTS 0782192  7/1997  (EP) ............................. H01L/27/02

* cited by examiner

Primary Examiner—Michael J. Sherry
Assistant Examiner—Kim Huynh
(74) Attorney, Agent, or Firm—Theodore E. Galanthay; Robert Iannucci; Seed IP Law Group, PLLC

(57) ABSTRACT

An ESD protection network protects a CMOS circuit structure integrated in a semiconductor substrate. The circuit structure includes discrete circuit blocks formed in respective substrate portions which are electrically isolated from one another and independently powered from at least one primary voltage supply having a respective primary ground, and from at least one secondary voltage supply having a respective secondary ground. This network includes a first ESD protection element for an input stage of the circuit structure; a second ESD protection element for an output stage of the circuit structure, the first and second protection elements having an input/output pad of the integrated circuit structure in common; a first ESD protection element between the primary supply and the primary ground; and a second ESD protection element between the secondary supply and the secondary ground.

11 Claims, 3 Drawing Sheets

ESD PROTECTION NETWORK FOR CIRCUIT STRUCTURES FORMED IN A SEMICONDUCTOR

TECHNICAL FIELD

This invention relates to an ESD (electrostatic discharge) protection network for circuit structures formed in a semiconductor.

More particularly, the invention relates to an ESD protection network for a CMOS circuit structure integrated in a semiconductor substrate and comprising discrete circuit blocks formed in respective substrate portions which are electrically isolated from one another and independently powered, respectively from at least one primary voltage supply having a respective primary ground, and from at least one secondary power supply having a respective secondary ground.

BACKGROUND OF THE INVENTION

As is well known, many VLSI (very large scale integration) electronic devices have ESD protection elements connected therein. These protection elements are connected directly to the pads of each device.

ESD protection elements are active during an electrostatic discharge to limit the resulting voltage surge and establish a low-resistance path toward the device ground.

Electrostatic discharges may concern any pad pairs, so that it becomes necessary to protect the electronic device by means of a "minimum protection network". Such a network typically includes:

protective structures;

guard rings; and bias diffusions for the substrate.

In this way, a low-impedance path would be ensured for any electrostatic discharge configurations.

In general, a protection network cannot be defined on the basis of quantitative estimates, because identifying discharge paths through components whose bias conditions are unknown is quite difficult.

Also difficult is to estimate the effectiveness of discharge paths which are dependent on the layouts of parasitic/active structures.

It should be further considered that the need to have circuit blocks or portions isolated may place constraints on the layouts which don't favor the creation of discharge paths.

These problems are felt more acutely with those devices which have separate discrete power supply lines.

For example, some memory devices include buffer output stages associated with their input/output (I/O) ports. These memory devices have a primary power supply for which Vcc and GND voltage supply references are usually provided. By contrast, their buffer output stages have a voltage supply Vcc_IO, GND_IO, referred to as the "secondary" supply hereinafter, which is separate and independent of the primary supply to the memory device.

The buffer stages generally consist of CMOS inverters comprising a PMOS pull-up transistor and an NMOS pull-down transistor.

The NMOS transistors of the buffer output stages are formed in a P-doped substrate which is biased to the secondary input/output ground, i.e., that denoted by GND_IO. The PMOS transistors are instead formed within an N-well biased to the secondary power supply Vcc_IO. On the other hand, the buffer input stages are formed in a ground biased native P substrate.

Now, the need to provide ESD protection for the CMOS circuitry of both supplies involves the use of respective protection elements biased by the two grounds GND, GND_IO in the same substrate. This, however, introduces a noise propagation line.

The presence of noise in CMOS devices may cause overshooting on the supply lines Vcc, GND, the overshoot being produced by fast switching of the buffer output stages of the input/output ports.

With the requirement for immunity to noise also to be met, conventional protection networks are unsuitable for use in a device as just described.

Even if an attempt were made at maintaining the connections to the substrate through the internal circuitry ground GND alone, the protection elements of the input/output circuitry toward the secondary ground GND_IO would introduce a diode wherethrough noise can be passed anyway. The noise intensity, in fact, lies well above the threshold of the forward-biased diode.

SUMMARY OF THE INVENTION

An embodiment of this invention provides an ESD protection network for VLSI electronic devices incorporating circuit blocks which are formed discretely in respective substrate portions isolated electrically from one another and powered independently.

The ESD protection network has such constructional and functional features as to be immune to substrate noise, and accordingly, allow the different circuit blocks to be isolated from noise or disturbance.

The ESD protection network provides, on the occurrence of an ESD discharge, a low-impedance path between any pair of pads of the integrated circuit structure.

The features and advantages of a protection network according to the invention will be apparent from the following description of an embodiment thereof, given by way of non-limitative example with reference to the accompanying drawings.

DETAILED DESCRIPTION

Figure 1:
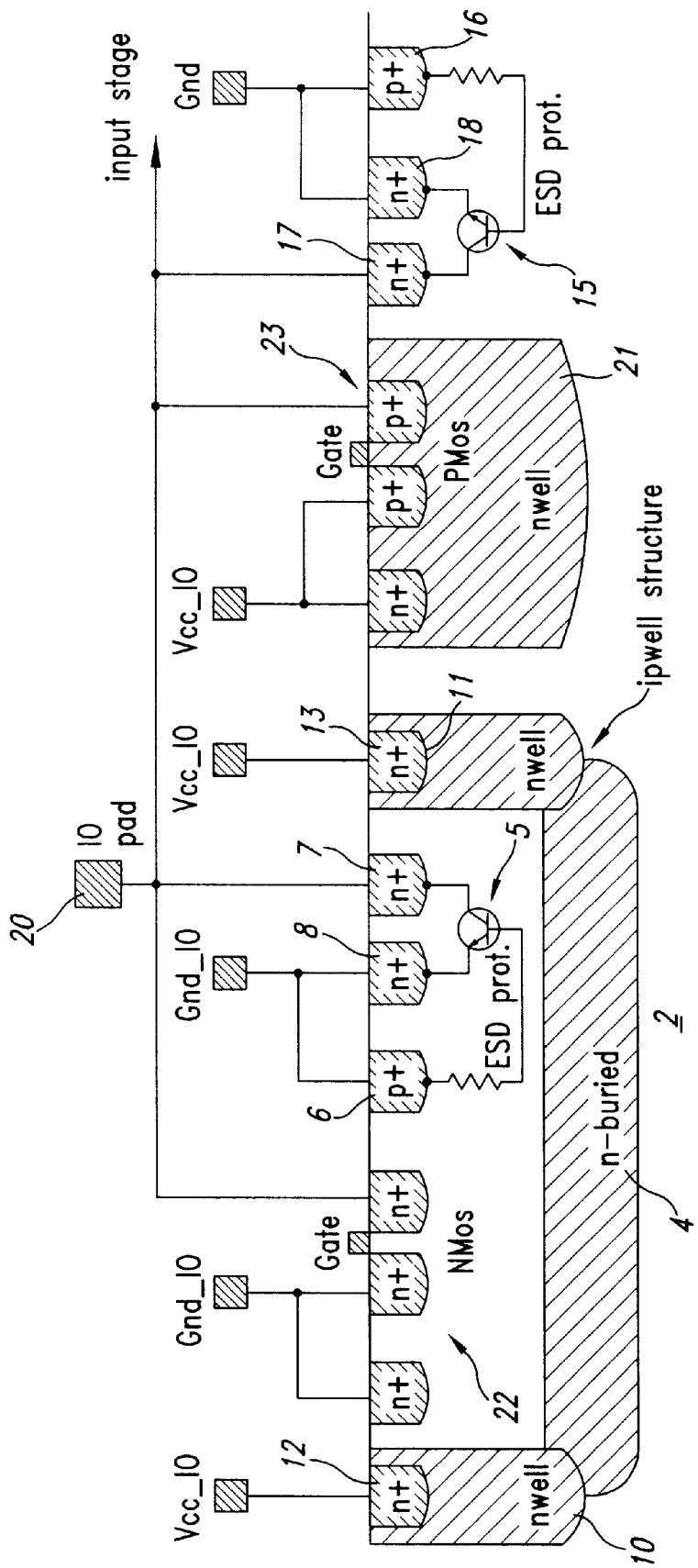
FIG. 1 shows schematically, in vertical cross-section and drawn to an enlarged scale, a semiconductor wherein a CMOS integrated circuit structure provided with an ESD protection network according to the invention has been formed.
Figure 2:
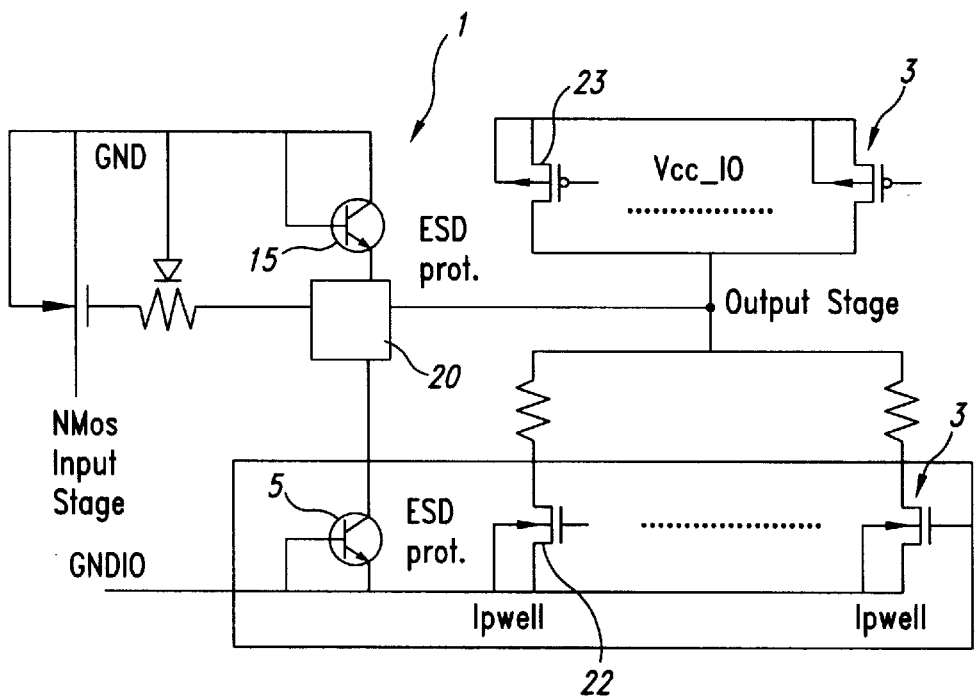
FIG. 2 is a diagrammatic view of an equivalent circuit to the structure of FIG. 1.

Referring to the drawing views, specifically to the example of FIGS. 1 and 2, generally and schematically shown at 1 is an ESD protection network according to the invention which is intended for electronic devices 3 integrated with BiCMOS technology.

The devices 3 are, preferably but not necessarily, CMOS buffer input/output stages for semiconductor integrated memory circuits. For simplicity, the devices 3 shown in FIGS. 1 and 2 will be discussed as output buffers, although the same discussion would apply to input buffers.

Each integrated circuit is provided a primary power supply which includes first Vcc and second GND voltage references. The buffer output stages 3 have a secondary voltage supply Vcc_IO, GND_IO which is separate from and independent of the primary supply to the memory circuit.

The buffer output stages 3 and network 1 are formed in a native semiconductor substrate 2. The substrate 2 has been doped with a selected dosage of a first dopant type, e.g., a P-type dopant, and has a high resistivity of a few tens of ohms per centimeter.

A CMOS buffer input stage, comprising a complementary pair of MOS transistors, is formed in a separate, but adjacent portion of the substrate 2.

In accordance with the invention, a first local ESD protection element is provided for the buffer input stage of the integrated circuit structure. This protection element comprises a lateral npn bipolar transistor 15 formed at the substrate surface.

The transistor 15 has respective base 16, collector 17 and emitter 18 regions. The base 16 and emitter 18 regions are biased to the primary ground GND, while the collector region is connected to an input/output pad 20.

A CMOS buffer output stage is formed in a second portion of the substrate 2 and comprises a complementary pair of MOS transistors.

Advantageously in this invention, a buried N-well 4 is formed in the second portion of the substrate 2. The well 4 is preferably formed by a high-energy implantation of phosphorus.

The implantation energy would be in the MeV range.

A conventional NMOS transistor 22 is formed above the buried well 4, and constitutes the pull-down transistor of the CMOS buffer output stage 3. The other transistor of the buffer output stage is a PMOS pull-up transistor 23 which is formed inside an N-well 21.

The NMOS transistor 22 has its source and body terminals biased to the secondary ground GND_IO; its drain terminal is connected to the input/output pad 20.

According to the invention, a second local ESD protection element is provided which comprises a lateral npn bipolar transistor 5 for ESD protection. This transistor is formed at the surface of the substrate 2, laterally of the pull-down NMOS transistor.

The lateral transistor 5 has a base region 6, collector region 7 and emitter region 8.

The base region 6 is a surface region doped P+. The regions 7 and 8 are surface regions doped N+. The collector 7 is connected to the input/output pad 20, and the base 6 and emitter 8 regions are biased to the secondary ground GND_IO.

Advantageously, an N-well 10 is provided, as shown in FIG. 1, which extends down from the substrate surface to contact the buried well 4. The well 10 is formed on the NMOS transistor side.

In addition, a second N-well 11 extends down from the substrate surface to contact the buried well 4. The well 11 is formed on the bipolar transistor 5 side.

In this way, the substrate region which accommodates the NMOS 22 and bipolar 5 transistors is fully isolated from the native substrate 2.

The structure resulting from the interpenetration of the wells 10, 4 and 11 is an ip-well isolation integrated structure, i.e., a dummy triple well formed with a CMOS process.

The isolation provided is both lateral and bottom isolation. In fact, as clearly shown in FIG. 1, the lateral ESD protection bipolar 5 is fully isolated from the native substrate 2 by means of the N-well barriers 10 and 11 in contact with the buried well 4.

The buried well 4 is communicated to the secondary voltage supply reference Vcc through respective contact regions 12 and 13 formed in the wells 10 and 11 at the surfaces of the latter.

In an alternative embodiment, the structure of the transistor 5 can be optimized by splitting it into several parallel-connected branches which allow an N+diffusion of plural de-coupling series resistors to be introduced. A protection element is thus provided from the pad 20 toward the secondary ground GND_IO.

The second protection element 5 prevents an ESD discharge from being sunk through the NMOS transistor of the buffer output stage due to a "snap-back" phenomenon involving a parasitic bipolar transistor associated with the NMOS transistor.

FIG. 2 is a diagrammatic view of an equivalent circuit to the structure of FIG. 1. It can be noticed from FIG. 2 that the first 15 and second 5 ESD protection elements are connected together through the input/output pad 20.

Thus, according to the invention, a protection transistor is provided for each pair of pads.

In essence, a low-impedance path is established between any pin pair of the integrated circuit upon the occurrence of an ESD discharge.

The discharge paths toward ground are defined by the local protection elements of the various pads.

The network 1 of this invention further includes discharge paths which protect from other ESD configurations using protection elements between the various supplies.

Each power supply is, in fact, protected toward its corresponding ground by an ESD protection element.

Figure 3:
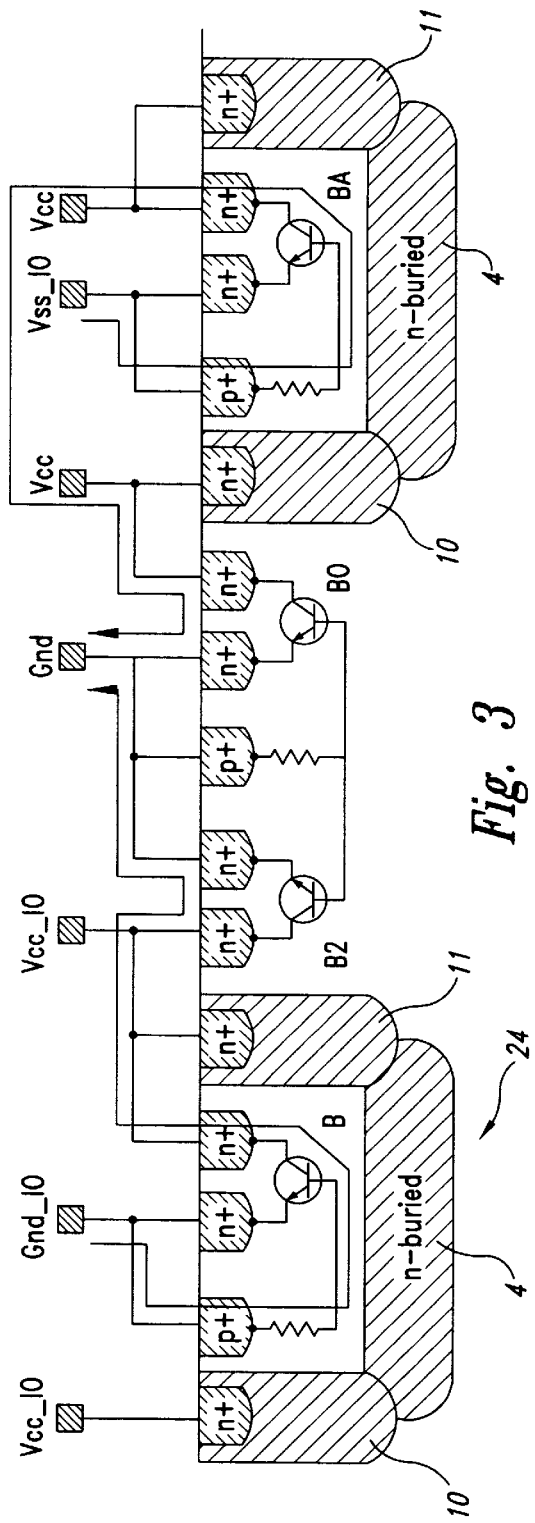
FIG. 3 shows schematically, in vertical cross-section and to an enlarged scale, a portion of a semiconductor wherein ESD protection elements according to the invention have been formed.

Referring in particular to the example of FIG. 3, a lateral npn bipolar transistor B0 is provided between the primary supply Vcc and the primary ground GND.

Transistors of this type are provided at the corners of the integrated circuit for the purpose of reducing the resistive contribution from the metal interconnects to the path ESD.

A lateral npn bipolar transistor B is provided between the secondary supply Vcc_IO and the secondary ground GND_IO. This transistor is formed within an ip-well isolation integrated structure 24 which is identical with that described in connection with the wells 10, 4 and 11 of FIG. 1.

Since in a memory circuit, the input/output ports would usually be split into two distinct sets, bipolar transistors of the B type should be provided in each set.

Figure 4:
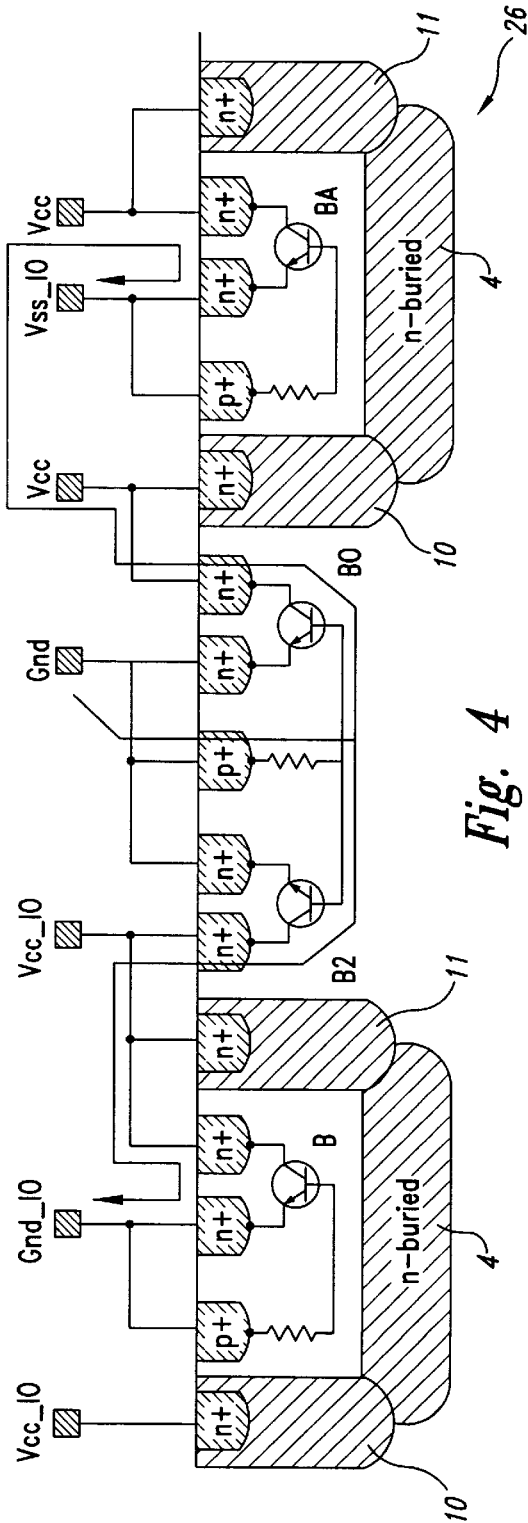
FIG. 4 shows schematically, in vertical cross-section and to an enlarged scale, a portion of a semiconductor wherein additional ESD protection elements according to the invention have been formed.

A further aspect of this invention will now be described with reference to the example of FIG. 4, concerning cross-protection between the primary and secondary power supplies.

A lateral bipolar BA is provided between the primary supply Vcc and the secondary ground GND_IO. This transistor BA is connected within an ip-well isolation integrated structure 26 identical with that described in connection with the wells 10, 4 and 11 of FIG. 1.

An additional bipolar transistor B2 is formed in the substrate 2 and connected between the secondary supply Vcc_IO and the primary ground GND.

The ESD protection network shown in FIG. 4 also includes the protection transistors B and B0, described with reference to FIG. 3 and intended for protection between one supply and its corresponding ground.

It should be noted that the transistors B and B0 can be regarded as optional, because the conduction path that they afford may be provided by the other transistors BA and B2 in cooperation with parasitic transistors present in the network 1. Accordingly, where one is confronted with problems of circuit area occupation, the transistors B and B0 can be omitted.

The protection network of this invention ensures effective immunity to noise because the connection between the various power supplies always takes place through reverse-biased diodes. The breakdown threshold of such diodes is a high one, much higher than the supply value and the noise level.

The cross protection elements in this invention provide an effective discharge path, and allow the circuit to be powered on even during an ESD discharge.

The conduction paths which are active during an ESD discharge have thus been discussed; in particular, the paths between the power supplies, and the local paths between the input pads and the input/output pads toward their respective grounds, have been discussed.

There remains to be ascertained the effectiveness of the network 1 of this invention versus the possible occurrence of electrostatic discharges between the input and/or input/output pads toward the power supplies, and between the input and/or input/output pads toward the other inputs and/or inputs/outputs.

Figure 5:
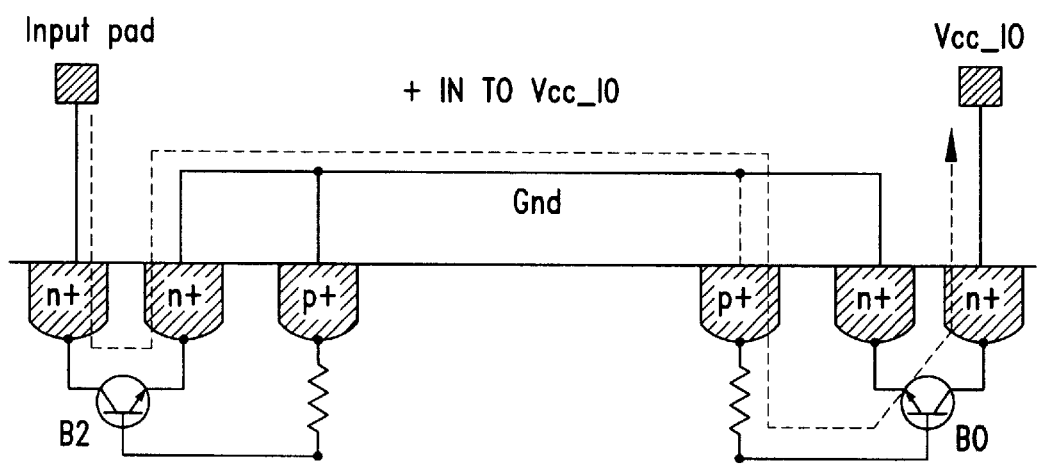
FIG. 5 shows schematically a section of a semiconductor including a protective path along which a positive discharge is directed from an input pad to a secondary voltage supply of the integrated circuit structure.

Shown schematically in FIG. 5 is a semiconductor section crossed by a protection path along which a positive discharge is occurring from an input pad to the secondary supply Vcc_IO. It can be appreciated that this path involves the protection elements B2, B0 discussed in the foregoing.

Actual tests carried out by the applicants have shown that the protection network of the invention is thorough and effective against any types of electrostatic discharges that may concern the integrated circuit pins.

In fact, between any pair of pins there exists now a low-impedance path which is only active during an ESD pulse. Thus, the network 1 is able to prevent electrostatic energy from being sunk through the CMOS circuitry.

The ESD protection network of this invention is specially effective in devices which have separate power supplies.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An ESD protection network for a CMOS circuit structure integrated in a semiconductor substrate and comprising discrete circuit blocks formed in respective substrate portions which are electrically isolated from one another and independently powered from at least one primary voltage supply having a respective primary ground, and from at least one secondary voltage supply having a respective secondary ground, the ESD protection network comprising:

a first ESD protection element for an input stage of the circuit structure;

a second ESD protection element for an output stage of the circuit structure, said first and second protection elements having in common an input/output terminal of the circuit structure;

a third ESD protection element between the primary voltage supply and the primary ground; and a fourth ESD protection element between the secondary voltage supply and the secondary ground, wherein said second protection element is a bipolar transistor fully isolated from the substrate by a first isolation structure that includes a first buried well in the substrate and first and second side wells extending down from a surface of the substrate to contact opposite ends of the buried well, the substrate having a first conductivity type and the buried well and side wells being doped to have a second conductivity type, wherein said second protection element is a lateral npn bipolar transistor having a base region, a collector region and an emitter region, with the collector region being connected to said input/output terminal and the base and emitter regions being biased to the secondary ground.

2. An ESD protection network according to claim 1 wherein the circuit structure includes plural pairs of pads and the ESD protection network includes, one protection element for each pair of pads of the circuit structure.

3. An ESD protection network according to claim 1, wherein each protection element includes a lateral npn bipolar transistor.

4. An ESD protection network according to claim 1, wherein said buried well is biased to said secondary voltage supply.

5. An ESD protection network according to claim 1, wherein said fourth protection element between the secondary supply and the secondary ground is a bipolar transistor fully isolated from the substrate by a second isolation structure which comprises a second buried well in the substrate and opposite wells extending down from the substrate surface to contact the second buried well.

6. An ESD protection network for a CMOS circuit structure integrated in a semiconductor substrate and comprising discrete circuit blocks formed in respective substrate portions which are electrically isolated from one another and independently powered from at least one primary voltage supply having a respective primary ground, and from at least one secondary voltage supply having a respective secondary ground, the ESD protection network comprising:

a first ESD protection element for an input stage of the circuit structure;

a second ESD protection element for an output stage of the circuit structure, said first and second protection elements having in common an input/output terminal of the circuit structure;

a third ESD protection element between the primary voltage supply and the primary ground; a fourth ESD protection element between the secondary voltage supply and the secondary ground;

a fifth protection element connected between the primary supply and the secondary ground; and a sixth protection element connected between the secondary supply and the primary ground.

7. An ESD protection network according to claim 6, wherein said fifth protection element is a bipolar transistor fully isolated from the substrate by an isolation structure which comprises a buried well in the substrate and opposite wells extending down from a surface of the substrate to contact the buried well.

8. An integrated circuit, comprising:

a primary power source having a primary power pad and a primary ground pad;

a secondary power source having a secondary power pad and a secondary ground pad;

a first ESD protection element having a current path connected between the primary power pad and the secondary ground pad; and a second ESD protection element having a current path connected between the secondary power pad and the primary ground pad;

wherein the first ESD protection element is integrated in a semiconductor substrate with the integrated circuit being protected and is fully isolated from the substrate by an integrated isolation structure that includes a buried well and side wells that extend down from a surface of the substrate and contact opposite ends of the buried well.

9. The integrated circuit of claim 8, further comprising:

an I/O pad;

a third ESD protection element coupled between the primary ground pad and the I/O pad; and a fourth ESD protection element coupled between the secondary ground pad and the I/O pad.

10. The integrated circuit of claim 8 wherein the isolation structure is biased to the primary power supply pad.

11. The integrated circuit of claim 8, further comprising:

a third protection element having a current path connected between the primary power pad and the primary ground pad; and a fourth protection element having a current path connected between the secondary power pad and the secondary ground pad.

* * * * *